(12) United States Patent
Yao et al.

(10) Patent No.: US 8,866,064 B2
(45) Date of Patent: Oct. 21, 2014

(54) MULTI-DIRECTIONAL PROXIMITY SENSOR

(75) Inventors: Yufeng Yao, Singapore (SG); Chee Heng Wong, Singapore (SG); Sze Ping Ong, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 425 days.

(21) Appl. No.: 13/191,260

(22) Filed: Jul. 26, 2011

(65) Prior Publication Data

US 2013/0026350 A1 Jan. 31, 2013

(51) Int. Cl.
| | |
|---|---|
| H01J 40/14 | (2006.01) |
| H01L 31/173 | (2006.01) |
| H01L 33/62 | (2010.01) |
| H03K 17/96 | (2006.01) |
| G01V 8/20 | (2006.01) |

(52) U.S. Cl.
CPC .............. *G01V 8/20* (2013.01); *H03K 17/9631* (2013.01); *H03K 17/9629* (2013.01); *H01L 31/173* (2013.01)
USPC .............. 250/221; 250/239; 257/82; 257/433

(58) Field of Classification Search
USPC .............. 250/221, 222.1, 239, 338.1, 339.06; 257/431, 433, 82, 81, 687; 345/173, 345/175
See application file for complete search history.

(56) References Cited

U.S. PATENT DOCUMENTS

| | | | | |
|---|---|---|---|---|
| 5,506,445 A | * | 4/1996 | Rosenberg | 257/666 |
| 5,869,896 A | * | 2/1999 | Baker et al. | 257/724 |
| 5,907,178 A | * | 5/1999 | Baker et al. | 257/433 |
| 8,110,789 B2 | * | 2/2012 | Pei | 250/222.1 |
| 8,358,282 B2 | * | 1/2013 | Song et al. | 345/173 |
| 8,420,999 B2 | * | 4/2013 | Costello et al. | 250/221 |
| 8,450,679 B2 | * | 5/2013 | Yun | 250/239 |
| 2006/0016994 A1 | * | 1/2006 | Basoor et al. | 250/338.1 |
| 2008/0011940 A1 | * | 1/2008 | Zhang et al. | 250/214 AL |
| 2008/0296478 A1 | * | 12/2008 | Hernoult | 250/216 |
| 2010/0038524 A1 | * | 2/2010 | Pei | 250/222.1 |
| 2010/0095206 A1 | | 4/2010 | Kim | |
| 2010/0167783 A1 | | 7/2010 | Alameh et al. | |
| 2010/0181467 A1 | * | 7/2010 | Chang | 250/221 |
| 2010/0207879 A1 | | 8/2010 | Fadell et al. | |
| 2010/0282951 A1 | * | 11/2010 | Costello et al. | 250/221 |
| 2010/0321289 A1 | | 12/2010 | Kim et al. | |
| 2010/0331050 A1 | * | 12/2010 | Tahk et al. | 455/566 |
| 2011/0057104 A1 | * | 3/2011 | Yao et al. | 250/338.1 |
| 2011/0096033 A1 | | 4/2011 | Ko | |
| 2011/0133941 A1 | * | 6/2011 | Yao et al. | 340/600 |
| 2011/0147102 A1 | * | 6/2011 | Song et al. | 178/18.09 |
| 2011/0248152 A1 | * | 10/2011 | Svajda et al. | 250/221 |
| 2011/0297831 A1 | * | 12/2011 | Yao et al. | 250/338.4 |
| 2011/0312349 A1 | * | 12/2011 | Forutanpour et al. | 455/466 |
| 2012/0086018 A1 | * | 4/2012 | Yao et al. | 257/82 |

(Continued)

*Primary Examiner* — John Lee

(57) ABSTRACT

A proximity sensor with multi-directional movement detection is provided. The proximity sensor may include an ASIC chip; at least three light sources configured to emit light in a particular sequence; and a photo detector configured to receive light and generate an output signal. The multi-directional proximity sensor may have a first proximity sensor with at least one side surface and a second proximity sensor connected to the first proximity sensor configured to detect object movement over a plane substantially parallel to the at least one side surface of the first proximity sensor. The multi-directional movement detection proximity sensor may include a PCB, in which more than one proximity sensor may be disposed on the PCB and operatively integrated to detect multi-directional movement.

18 Claims, 6 Drawing Sheets

(56) References Cited

U.S. PATENT DOCUMENTS

| | | |
|---|---|---|
| 2012/0132793 A1* | 5/2012 | Campbell et al. .............. 250/221 |
| 2012/0160994 A1* | 6/2012 | Costello et al. ............... 250/221 |
| 2012/0176277 A1* | 7/2012 | Malek et al. .................. 343/702 |
| 2013/0010310 A1* | 1/2013 | Wong et al. ................... 356/623 |
| 2013/0026350 A1* | 1/2013 | Yao et al. ...................... 250/221 |

* cited by examiner

MULTI-DIRECTIONAL PROXIMITY SENSOR

BACKGROUND

Proximity sensors are conventionally used to detect the presence of an object without any physical contact. A typical proximity sensor comprises a light source to emit light and a photo detector to detect light reflected by an object that is within a predetermined proximity of the sensor.

Proximity sensors have been widely used in many devices and also for many industrial applications. For example, in an automated production assembly line, proximity sensors are used to detect the position of a machine component in the production line and also for counting of parts produced by a production tool. Whereas in the robotics industry; the proximity sensor may be used to monitor a robot's position and control the movements of the robot. The proximity sensor is also commonly used as an electronic switch to open and close an electrical circuit when an object is detected by the sensor. More recently, optical proximity sensors have been widely employed in portable electronic devices, such as a portable handheld device, mobile phone and portable computers.

In general, a proximity sensor comprises an invisible light source and a photo detector. When an object comes within a predetermined distance of the sensor, the object reflects the light from the light source toward the photo detector. After sensing the reflected light, the photo detector subsequently sends an output signal, indicating the presence of an object. Typically, an action is performed in response to the output signal, such as turning on water, opening a door, etc. Thus, the conventional proximity sensors are utilized merely to facilitate the detection of an object within a predetermined proximity of the sensor. Despite the ability to detect objects without any physical contact, conventional proximity sensors provide only heretofore been utilized for object detection in either the horizontal or vertical direction of a plane parallel to the top surface of the proximity sensor. Thus, the use of proximity sensors in electronic devices has heretofore been limited to merely performing single plane object detection.

In conventional design, in order to provide movement detection or an X-Y direction motion sensing function to a proximity sensing device, a dedicated X-Y motion detecting device has to be integrated along with a proximity sensor. As a result, this increases the cost and also the overall size of the device because more space is needed to accommodate two separate systems. Accordingly, it would be desirable to provide a single device or system that is functionally capable of providing proximity sensing operations, an X-Y directions motion sensing operations as well as being able to provide multi-directional movement detection.

BRIEF DESCRIPTION OF THE DRAWINGS

Throughout the description and figures, similar reference numbers may be used to identify similar elements.

DETAILED DESCRIPTION

Figure 1:
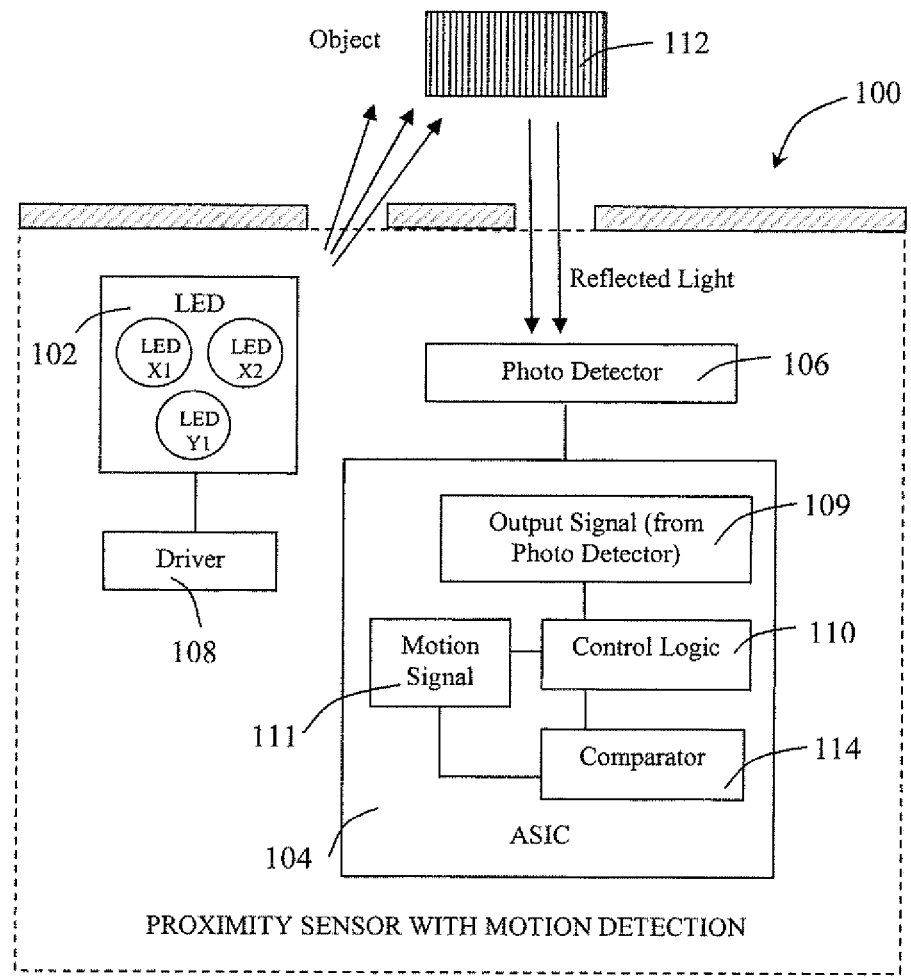
FIG. 1 illustrates a block diagram of a proximity sensor with movement detection.

Proximity sensors are particularly useful for detecting the presence of an object without the need for physical contact. FIG. 1 illustrates a block diagram of a proximity sensor with movement detection. The proximity sensor 100 and corresponding multi-direction motion detection function are described in more detail below and various embodiments of the invention are shown in FIG. 1 to FIG. 6. However, it is to be understood that other embodiments may be modified without departing from the scope of the present invention. For example, the proximity sensor may be modified to provide additional input functions, such as an additional function for manipulating a cursor and scrolling or providing a mouse clicking event function. In such an instance, a navigation engine (not shown) may be incorporated with the proximity sensor to convert the movement detection signals generated by the proximity sensor into navigation input functions.

The proximity sensor 100 includes a plurality of light sources or LED 102, an ASIC (application specific integrated circuit) chip 104 and a photo detector 106. The proximity sensor 100 may further include a driver 108 coupled the LED 102, configured to generate a drive current with a predetermined timing sequence. The LED 102 may be configured to emit light in response to an applied current having a particular timing or under a certain sequence. The LED 102 may be any suitable source of infrared (IR) LED, which is capable of emitting light at a desirable wavelength and intensity. The selection of the LED 102 may vary depending on the application; and also on its ability to provide the required intensity in producing an optimum light reflection on to the photo detector 106. As shown herein below, LED 102 may include LED $X_1$, LED $X_2$, and LED $Y_1$. Other combinations are possible, such as $Y_2$.

The photo detector 106 is operable to receive light and generate an output signal 109 in response. In general, a photo detector 106 may convert light or electromagnetic radiation that strikes it into a current. For simplicity, throughout this specification, the electromagnetic radiation (or output signal 109) may be referred to simply as the light and the current generated by the photo detector 106, in response to the light it receives. In an operational embodiment, if there is an object 112 placed near the proximity sensor 100, the light emitted by the LED 102 may be reflected toward the photo detector 106 and subsequently cause the photo detector 106 to generate an output signal 109 in response. Therefore, the output signal 109 may be expected to contain a signal profile that corresponds to the sequence of the light emitted by the LED 102. Conversely, if there is no object present to reflect the light emitted by the LED 102, the incident light, if any, received by the photo detector 106 may be from other sources, and this leads to the generation of a different kind or unknown output signal profile, which may be ignored or canceled subsequently by the system.

In one embodiment, the ASIC chip 104 may be coupled with the photo detector 106, configured to receive the output signal 109 from the photo detector 106 and report a detection of an object 112 movement. The ASIC chip 104 may further include control logic 110 and a comparator 114. In one embodiment, the control logic 110 may be configured to process the output signal 109 to generate a motion signal 111. The comparator 114 may be configured to receive the motion signal 111 and to report a movement upon determining the presence of a predetermined profile in the motion signal 111.

In one embodiment, the predetermined profile may include a profile of a motion signal 111 generated by the control logic 110 in correspondence to certain movements of an object 112 over the proximity sensor 100. In one embodiment, when the object 112 moves over the proximity sensor 100 in a particular direction, a motion signal 111 having a specific signal profile may be generated by the control logic 110 to represent that particular movement. For example, when the object 112 moves along the X-axis or horizontal axis over the proximity sensor 100, the control logic 110 may process the output signal 109, generated by the photo detector 106 and produce a unique motion signal profile in correspondence to that horizontal movement. Hence, a set of predetermined motion signal profiles may be created by exposing the proximity sensor 100 to various predetermined object movements. The set of predetermined or known motion signal 111 profiles may include a horizontal movement output signal profile, which represents a horizontal movement of an object 112 along the X-axis over the proximity sensor 100. A vertical movement motion signal 111 profile may represent a vertical movement of an object 112 along the Y-axis. Therefore, in a situation where a signal profile 111 generated by the control logic 110 matches one of the predetermined profiles from among a set of known motion signal profiles, the associated type of object movement may be immediately identified.

Figure 2:
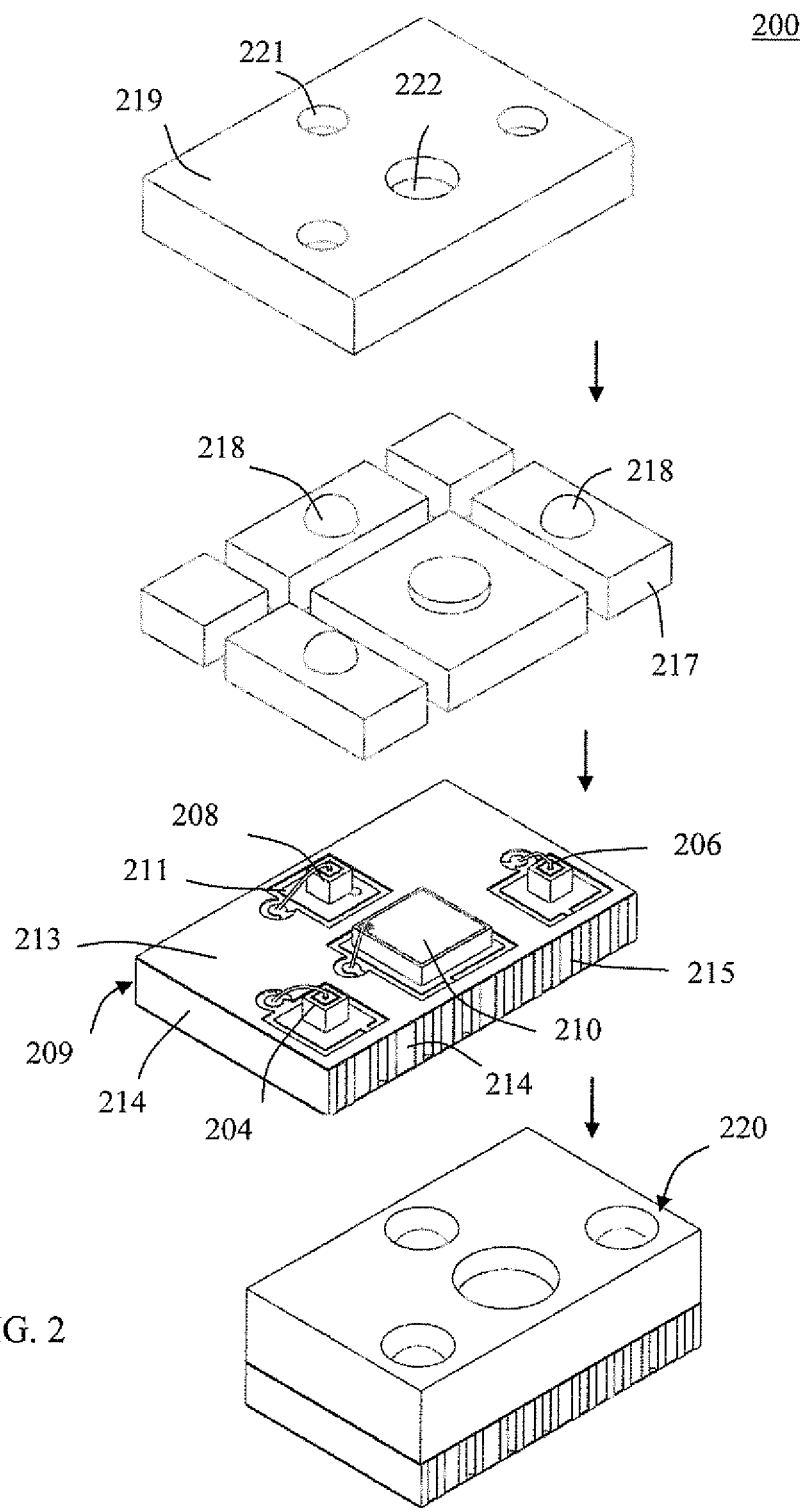
FIG. 2 illustrates an exploded, perspective view of a proximity sensor.

FIG. 2 illustrates a perspective exploded view of a proximity sensor 200. The proximity sensor 200 may include three infrared LEDs, 204, 206, 208, namely $X_1$, $X_2$, and $Y_1$, respectively; and a photo detector 210 disposed on a substrate 209. The LEDs (204-208) and the photo detector 210 may be electrically connected to the substrate 209 by one or more wire bonds 211. In one embodiment, the LEDs (204-208) are disposed adjacent to three sides of the proximity sensor in a triangular pattern, whereas the photo detector 210 is disposed at a substantially equal distance from the LEDs (204-208). The proximity sensor 200 may include an ASIC chip (not shown) stacked below the photo detector 210.

In one embodiment, the substrate 209 may include a top surface 213 and a plurality of side surfaces 214. The LEDs (204-208), the ASIC chip (not shown) and the photo detector 210 may be disposed on the top surface 213 of the substrate 209. The LEDs (204-208) and the ASIC chip (not shown) may be electrically connected to the top surface 213 of the substrate 209 by one or more wire bonds 211. In one embodiment, the side surface 214 may further include a plurality of side contact pads 215 configured to allow the proximity sensor 200 to be connected with another proximity sensor (not shown) or a second proximity sensor. The second proximity sensor may be configured to detect object movement over a plane which is substantially parallel to the side surface 214.

In one embodiment, one or more of the plurality of side contact pads 215 may be further configured to provide electrical power to the other proximity sensor (not shown) that is being connected thereon. In an alternative embodiment, each side surface 214 may be connected with another proximity sensor. For example, depending on the application, all four side surfaces of the proximity sensor 200 may include a plurality of side contact pads 215 on each of the side surfaces 214. Each side surface 214 may be further connected with one proximity sensor 200, respectively, configured to provide multiple directional movement detection. In one embodiment, the side contact pads 215 may also be operatively configured to allow the plurality of connected proximity sensors to communicate detection signals between one another.

The proximity sensor 200 may also include an epoxy material 217 encapsulating the LEDs (204-208), the ASIC chip (not shown) and the photo detector 210. The epoxy material 217 may be a clear epoxy material configured to provide protection to these components and the wire bonds. The epoxy material 217 may be formed into its final form by any known molding process. The epoxy material 217 may further include a plurality of lenses 218 for light focusing. In one embodiment, the proximity sensor 200 may include a cover 219 made of a mold compound disposed over the epoxy material 217 to form the package 220. The cover 219 may include a plurality of LED apertures 221 located above each of the LEDs (204-208) and a photo detector aperture 222 above the photo detector 210, respectively. The light emitted by the LEDs (204-208) may pass through the LED apertures 221 towards an object (not shown) to be detected. After the light is reflected by an object (not shown) in close proximity with the proximity sensor 200, it may subsequently pass through the photo detector aperture 222 towards the photo detector 210, where it may be detected.

Figure 3:
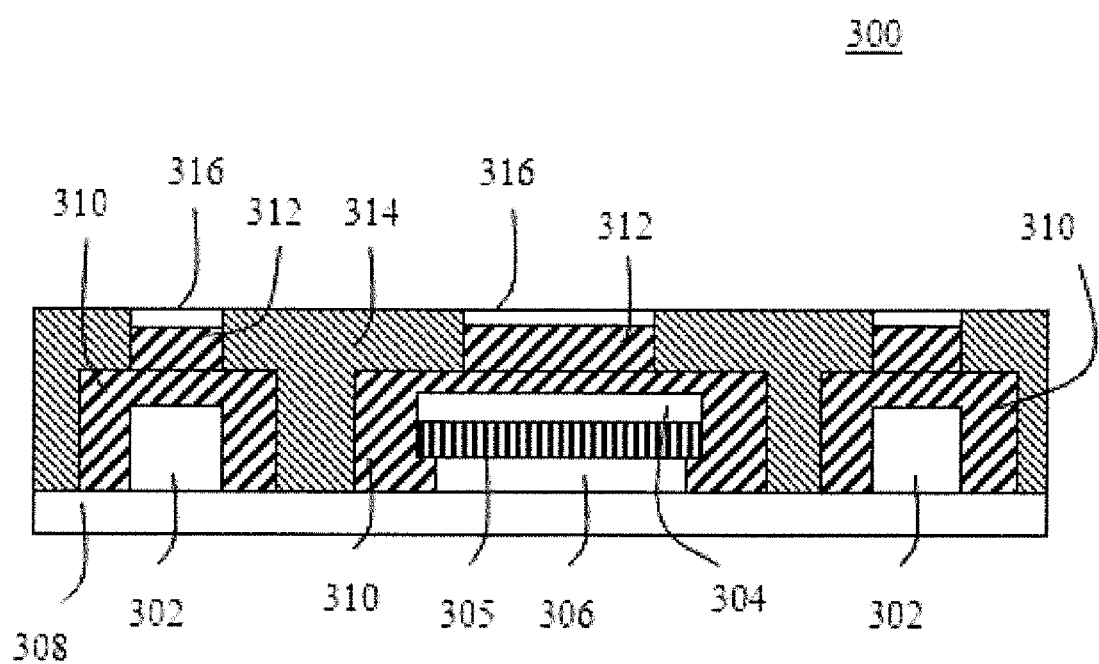
FIG. 3 illustrates a cut-away view of a proximity sensor package.

FIG. 3 illustrates a cut-away view of a proximity sensor package 300. The proximity sensor package 300 includes a plurality of LEDs 302, a photo detector 304 and an ASIC chip 306 disposed on and electrically connected to a PCB 308 by one or more wire bonds (not shown). In one embodiment, the photo detector 304 is stacked on the ASIC chip 306 and separated from the ASIC chip 306 by a spacer 305. The spacer 305 may be configured to insulate the ASIC chip 306 from the photo detector 304. The proximity sensor 300 may also include a transparent or a clear mold compound 310 for encapsulating the LEDs 302, the ASIC chip 306 and the photo detector 304 together on the PCB 308, as well as to protect wire bonds (not shown). The mold compound may be accomplished by any suitable molding process. For example, the clear mold compound 310 may be molded over the LEDs 302, the ASIC chip 306 and the photo detector 304 by a conventional injection molding process. The clear mold compound 310 may be any suitable molding material. For example, the clear mold compound 310 may be manufactured by Nitto Denko having a part number NT8506. However, other transparent compounds, such as a transparent epoxy resin may also be used. In one embodiment, the clear mold compound 310 may further include a lens 312 disposed on the clear mold compound 310 for directing light from the LEDs 302 toward an object (not shown) and directing light reflected by an object (not shown) towards the photo detector 304. In an alternative embodiment, the lens 312 may also be formed simultaneously under the same molding process when the proximity sensor is being molded with the clear mold compound 310.

The proximity sensor 300 may also include a cover 314 made of a mold compound disposed over the clear mold compound 310 to form the proximity sensor package by a conventional injection molding process or other known process. The cover 314 may include a plurality of apertures 316 above the LEDs 302 and the photo detector 304. In one embodiment, the photo detector 304 may be stacked on the ASIC chip 306, so as to reduce the size of the package in order to produce an ultra-compact package. The overall thickness of the proximity sensor 300 may be limited by the thickness of the moldability of the cover 314 to form the package 300. For example, the proximity sensor 300 may have a rectangular package shape with dimensions in the X-Y plane 6 mm×4 mm and a thickness or a z-height of 1.5 mm.

Figure 4:
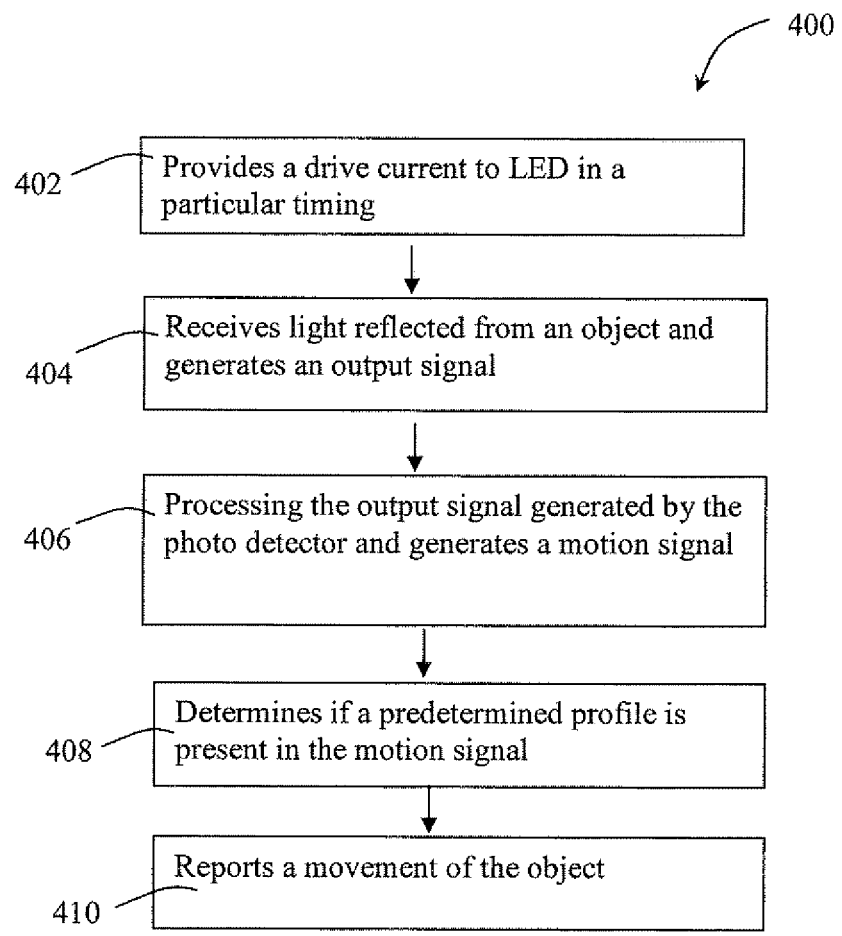
FIG. 4 illustrates a flow chart of a method for movement detection.

FIG. 4 illustrates a flow chart of one embodiment of a method for movement detection. At block 402, the driver provides a drive current to an LED in a particular timing sequence and causes the LED to emit light with a distinct characteristic. At block 404, the photo detector receives the light reflected from an object, if present, and generates an output signal in response to the light received. At block 406, the ASIC chip, or more specifically, the control logic of the ASIC chip processes the output signal generated by the photo detector, and subsequently, generates a motion signal. At block 408, the comparator determines if a predetermined profile of the motion signal is present in the motion signal generated by the control logic. The predetermined profile is a profile of a motion signal generated by the control logic in correspondence to a certain movement of an object over the proximity sensor. At block 410, the comparator reports a movement of the object upon determining the presence of a predetermined profile in the motion signals generated by the control logic. Therefore, when an object moves over the proximity sensor in a particular direction, the light generated by the LEDs) may be reflected back towards the photo detector. Hence the profile of the motion signal generated may be expected to have a similar profile as the motion signal profile that represents the particular movement of the object.

Figure 5:
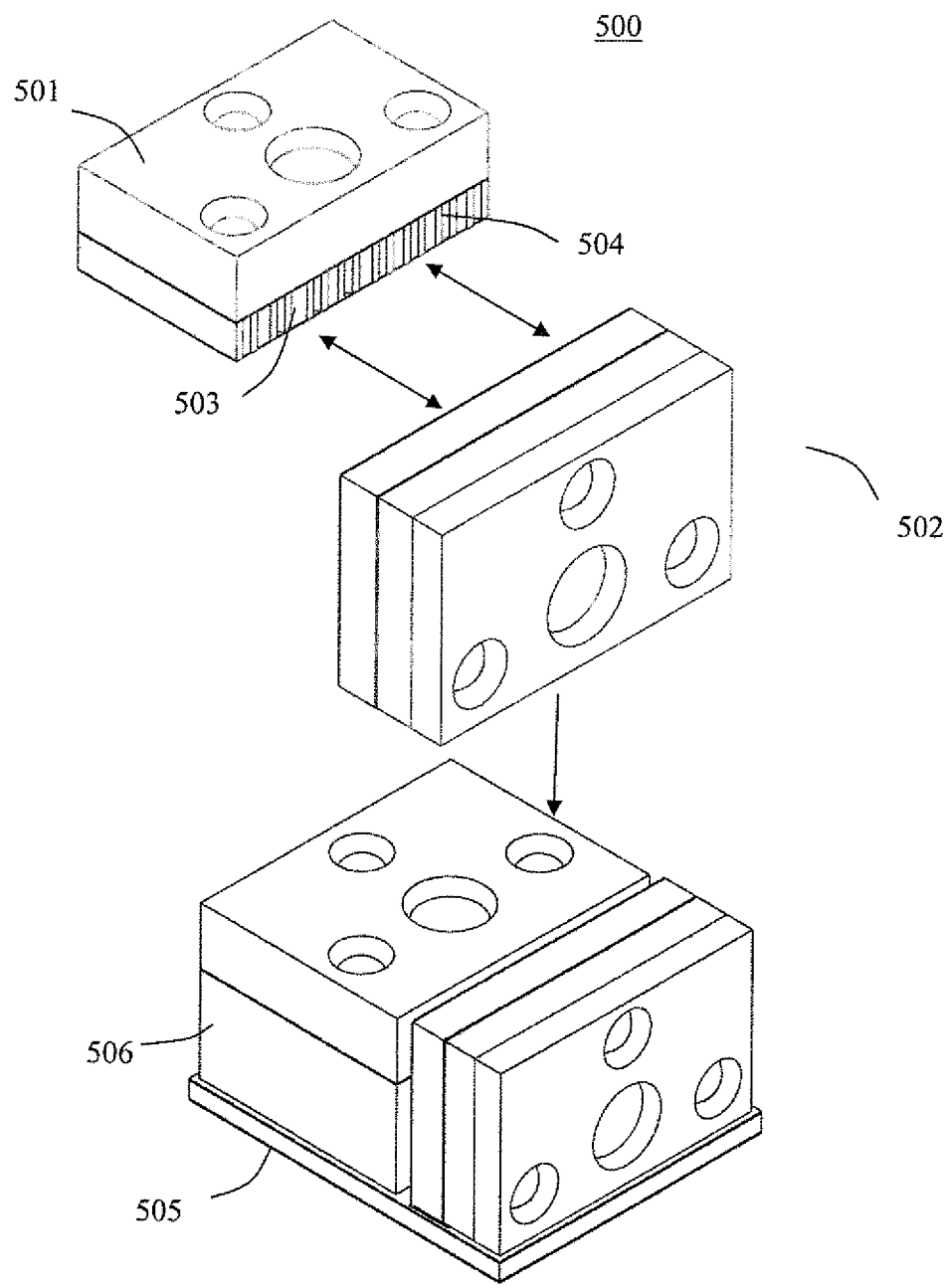
FIG. 5 illustrates an exploded, perspective view of a multi-directional movement detection proximity sensor.

FIG. 5 illustrates an exploded, perspective view of a multi-directional movement detection proximity sensor. In one embodiment, the proximity sensor 500 may include a first proximity sensor 501 and a second proximity sensor 502 operatively integrated and configured to provide multi-directional movement detection. In one embodiment, the first proximity sensor 501 may comprise at least one side surface 503, the side surface 503 may include a plurality of side contact pads 504 configured to receive the second proximity sensor 502. In one embodiment, the second proximity sensor 502 may be integrated with the first proximity sensor 501 to detect object movement over a plane which is substantially parallel to the side surface 503 of the first proximity sensor 501 that is mated with the second proximity sensor 502. The first proximity sensor 501 may be operably integrated with the second proximity sensor directly via the plurality contact pads 504. In one embodiment, both proximity sensors (501 and 502) may be operatively disposed on a common PCB 505. Alternative the second proximity sensor may be operatively connected to an interface PCB 506 and also the common PCB 505, both directly or indirectly. In one embodiment, the first proximity sensor 501 may be configured to provide electrical power to the second proximity sensor 502. The electrical power may be provided directly from the first proximity sensor 501 to the second proximity sensor 502 via the plurality of side contact pads 504. Alternatively the electrical power may be provided to both proximity sensors (501 and 502), directly or indirectly, via an interface PCB 506 which is configured to operatively connect both proximity sensors with each other. In another embodiment, the first proximity sensor 501 and the second proximity sensor 502 may be further operatively configured to communicate detection signals directly with one another via the plurality of side contact pads 504. The object detection signal detected by the second proximity sensor 502 may also be communicated to the first proximity sensor 501 for processing through the plurality of the contact pads 504 on the first proximity sensor 501.

In one embodiment, the first proximity sensor 501 and the second proximity sensor 502 may be disposed and electrically connected to a common PCB 505. The common PCB 505 may be a PCB or a flexible circuit. Both the first and second proximity sensors may be electrically integrated with each other on the common PCB 505 and configured to communicate with each other through the common PCB 505. Both the proximity sensors may be operably mounted on the PCB 505 by using a chip surface mounting machine. The chip surface mounting technology has been widely adopted in many automated chip manufacturing assembly lines and is particularly known to be an efficient and low cost process. However, another means of establishing electrical connections between a package and a PCB, such as a wire bonding, ball grid array, or conventional soldering process, may also be employed.

Figure 6:
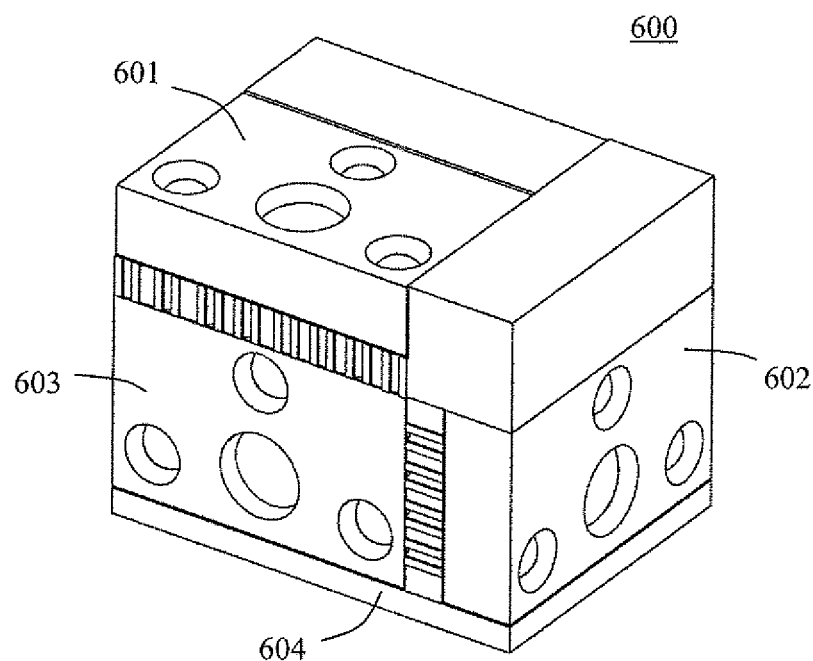
FIG. 6 illustrates a perspective view of a multi-directional movement detection proximity sensor.

FIG. 6 illustrates a perspective view of a multi-directional movement detection proximity sensor. The proximity sensor 600 may be configured to provide 3-Dimensional movement detection. In one embodiment, the proximity sensor 600 may include a first proximity sensor 601, a second proximity sensor 602 and a third proximity sensor 603 operatively integrated and configured to provide multi-directional movement detection. All proximity sensors (601-603) may be operatively connected directly or indirectly on a common PCB 604. In another embodiment, two additional proximity sensors (not shown) may be connected to the other two side surfaces (not shown) of the proximity sensor 601. For example, in addition to the existing proximity sensors (602 and 603), two extra proximity sensors (not shown) may be connected to the other two side surfaces the proximity sensor 601. In other words, a total of five proximity sensors may be integrated to provide all directional or 3-Dimentional movement detection.

Although specific embodiments of the invention have been described and illustrated herein, the invention is not to be limited to the specific forms or arrangements of parts so described and illustrated. The scope of the invention is to be limited and defined only by the claims appended hereto and their equivalents.

What is claimed is:

1. A proximity sensor with movement detection comprising:
   a plurality of light sources configured to emit light;
   a photo detector configured to receive light and generate an output signal;
   a substrate comprising a top surface and an opposing surface, wherein the photo detector, the plurality of light sources are mounted on the top surface of the substrate;
   at least one side surface of the substrate extending between the top surface and the opposing surface; and
   a plurality of side contact pads provided integrally within the substrate on the at least one side surface of the substrate, wherein the plurality of side contact pads extend planarly perpendicular to the top surface and the opposing surface, and wherein the plurality of side contact pads are being exposed so as to receive an electrical contact on the at least one side surface of the substrate.

2. The proximity sensor of claim 1, wherein the plurality of side contact pads of the at least one side surface of the substrate is configured to receive at least one other proximity sensor, wherein the at least one other proximity sensor is configured to detect object movement over a plane substantially parallel to the at least one side surface of the substrate perpendicularly relative to the top surface.

3. The proximity sensor of claim 2, wherein the at least one other proximity sensor is coupled to the proximity sensor via the plurality of side contact pads of the at least one side surface of the substrate.

4. The proximity sensor of claim 2, wherein the proximity sensor is configured to provide electrical power to the at least one other proximity sensor through the plurality of side contact pads.

5. The proximity sensor of claim 2, wherein the proximity sensor and the at least one other proximity sensor are operatively configured to communicate detection signals with each other through the plurality of side contact pads of the at least one side surface of the substrate.

6. A proximity sensor for multi-directional movement detection comprising:
   a first proximity sensor comprising a substrate having a top surface and an opposing surface;
   at least one side surface of the substrate extends planarly between the top surface and the opposing surface;
   a plurality of side contact pads provided integrally within the substrate on the at least one side surface of the substrate and being thereon; and
   a second proximity sensor connected to the at least one side surface of the substrate, the second proximity sensor configured to detect object movement over a plane substantially parallel to the at least one side surface of the substrate of the first proximity sensor,
   wherein the first proximity sensor further comprises a first light source, a second light source and a photo detector arranged between the first and second light sources, and wherein the first light source, the photo detector, and the second light source are arranged in parallel to the at least one side surface.

7. The proximity sensor of claim 6, wherein the first proximity sensor is configured to provide electrical power to the second proximity sensor by means of the plurality of side contact pads of the substrate.

8. The proximity sensor of claim 6, wherein both the first proximity sensor and the second proximity sensor are operatively configured to communicate detection signals with one another through the plurality of side contact pads of the substrate.

9. A multi-directional movement detection proximity sensor comprising:
   a PCB having a top surface and an opposing surface;
   at least one side surface of the PCB extending between the top surface and the opposing surface;
   a plurality of side contact pads provided integrally within the substrate, and being exposed planarly on the at least one side surface of the substrate;
   a first proximity sensor disposed on the top surface of the PCB; and
   a second proximity sensor operatively coupled to the first proximity sensor, wherein the second proximity sensor is connected to the plurality of side contact pads of the at least one side surface of the PCB and wherein the first and second proximity sensors are operatively integrated to detect multi-directional movement,
   wherein the first proximity sensor comprises a first light source, a second light source, a third light source and a photo detector disposed on the top surface of the PCB, and wherein the third light source is arranged such that the first light source, the second light source and the photo detector are the being interposed between the at least one side surface of the PCB and the third light source.

10. The proximity sensor of claim 9, wherein the second proximity sensor is operatively coupled to the first proximity sensor via the plurality of side contact pads.

11. The proximity sensor of claim 9, wherein the first proximity sensor and the second proximity sensor are operatively configured to communicate detection signals with one another via the PCB.

12. The proximity sensor of claim 1, wherein the substrate further comprises an additional side surface of the substrate having an additional plurality of side contacts extending orthogonally relative to the at least one side surface between the top surface and the opposing surface of the substrate.

13. The proximity sensor of claim 6, wherein the first proximity sensor comprises an additional side surface of the substrate extending orthogonally relative to the at least one side surface between the top surface and the opposing surface of the substrate, and wherein the proximity sensor further comprising a third proximity sensor disposed on the additional side surface of the substrate.

14. The proximity sensor of claim 9, wherein the PCB further comprising an additional side surface of the PCB extending orthogonally relative to the at least one side surface between the top surface and the opposing surface of the PCB, and wherein the proximity sensor further comprising a third proximity sensor disposed on the additional side surface of the PCB.

15. The proximity sensor of claim 1, wherein the plurality of light sources comprise a first light source and a second light source sandwiching the photo detector, wherein the first light source, the photo detector, and the second light source are arranged in parallel to the at least one side surface.

16. The proximity sensor of claim 15, wherein the plurality of light sources further comprising a third light source, and wherein the third light source is arranged such that the first light source, the second light source and the photo detector are being interposed between the at least one side surface of the substrate and the third light source.

17. The proximity sensor of claim 6, wherein the first proximity sensor further comprises a third light source, and wherein the third light source is arranged such that the first light source, the second light source and the photo detector are being interposed between the at least one side surface of the substrate and the third light source.

18. The proximity sensor of claim 9, wherein the photo detector is arranged between the first and second light sources, and wherein the first light source, the photo detector, and the second light source are arranged in parallel to the at least one side surface of the PCB.

* * * * *